United States Patent [19]

Lee et al.

[11] Patent Number: 5,023,190
[45] Date of Patent: Jun. 11, 1991

[54] IMPROVED CMOS PROCESSES

[75] Inventors: Ruojia Lee; Fernando Gonzalez, both of Boise, Id.

[73] Assignee: Micron Technology, Inc., Boise, Id.

[21] Appl. No.: 562,263

[22] Filed: Aug. 3, 1990

[51] Int. Cl.⁵ .................. H01L 21/265; H01L 21/336
[52] U.S. Cl. ........................................ 437/56; 437/34; 437/41; 437/44; 437/57; 437/58; 357/23.3; 357/42
[58] Field of Search ....................... 437/27, 28, 29, 30, 437/34, 40, 41, 44, 56, 57, 233, 186, 58; 357/40, 23.3, 42, 41, 44, 59 G

[56] References Cited

U.S. PATENT DOCUMENTS

| | | | |
|---|---|---|---|
| 4,182,023 | 1/1980 | Cohen et al. | 437/44 |
| 4,198,250 | 4/1980 | Jecmen | 437/44 |
| 4,406,049 | 9/1983 | Tam et al. | 437/56 |
| 4,562,638 | 1/1986 | Schwabe et al. | 437/44 |
| 4,697,332 | 10/1987 | Joy et al. | 437/29 |
| 4,806,500 | 2/1989 | Scheibe | 437/58 |
| 4,849,366 | 7/1989 | Hsu et al. | 437/56 |

FOREIGN PATENT DOCUMENTS

| | | |
|---|---|---|
| 0017164 | 1/1982 | Japan . |
| 0213051 | 10/1985 | Japan . |
| 0225859 | 10/1986 | Japan ................ 437/56 |
| 0165355 | 7/1987 | Japan . |

*Primary Examiner*—Olik Chaudhuri
*Assistant Examiner*—M. Wilczewski
*Attorney, Agent, or Firm*—Wells, St. John & Roberts

[57] ABSTRACT

In one aspect of the invention, a semiconductor chip having an array of memory cells and peripheral integrated circuitry comprises:
CMOS transistors in the memory array, with the n-channel transistors of the array being formed without LDD regions; and
the peripheral integrated circuitry comprising n-channel FET transistors, with such n-channel FET transistors being formed with LDD regions. In another aspect, disclosed is a CMOS process which produces a combination of n-channel MOS transistors having LDD spacers, n-channel MOS transistors void of LDD spacers, and p-channel MOS transistors.

18 Claims, 4 Drawing Sheets

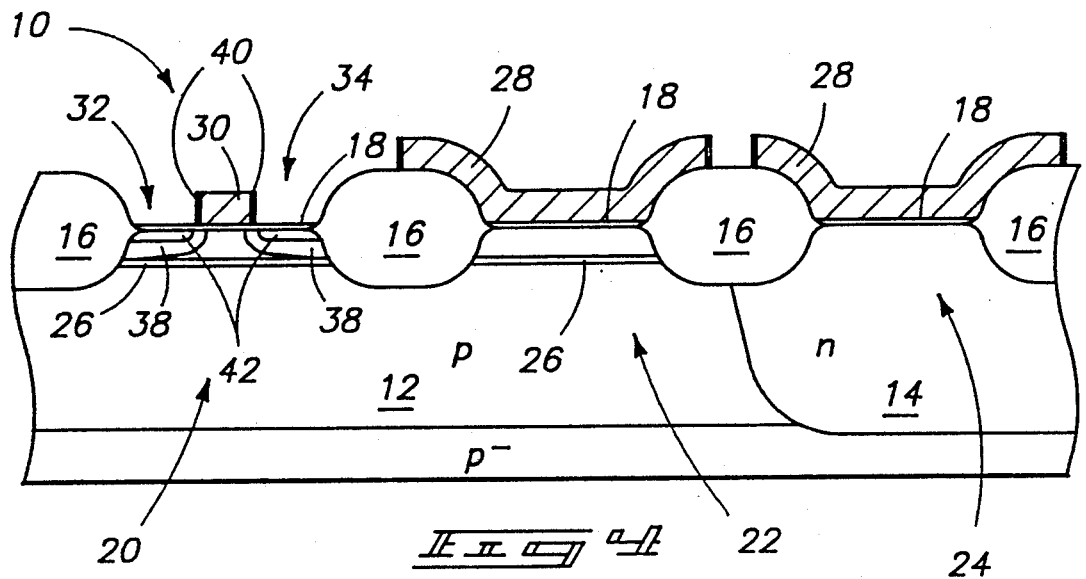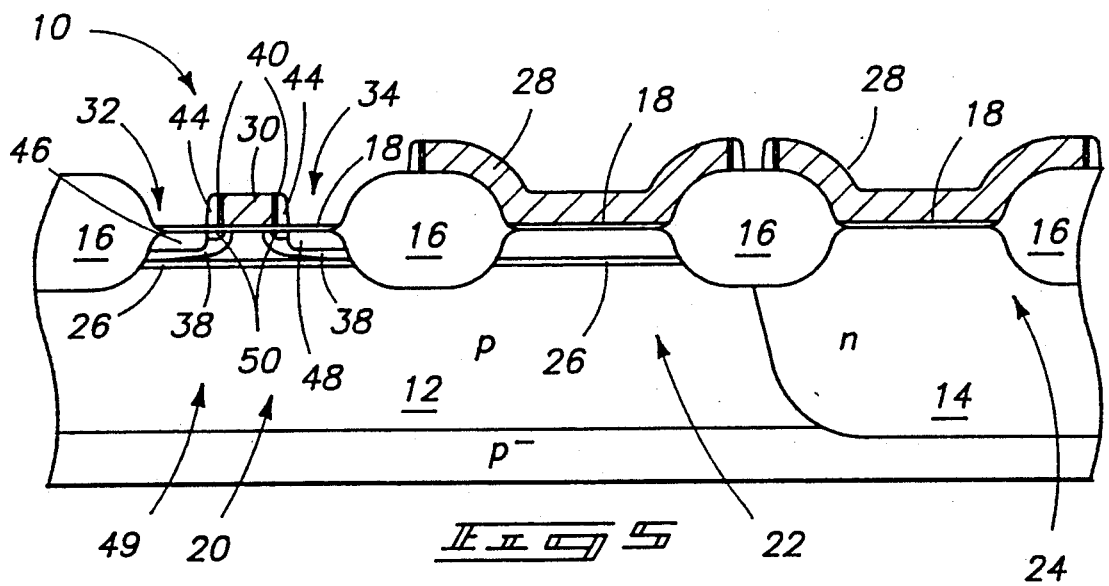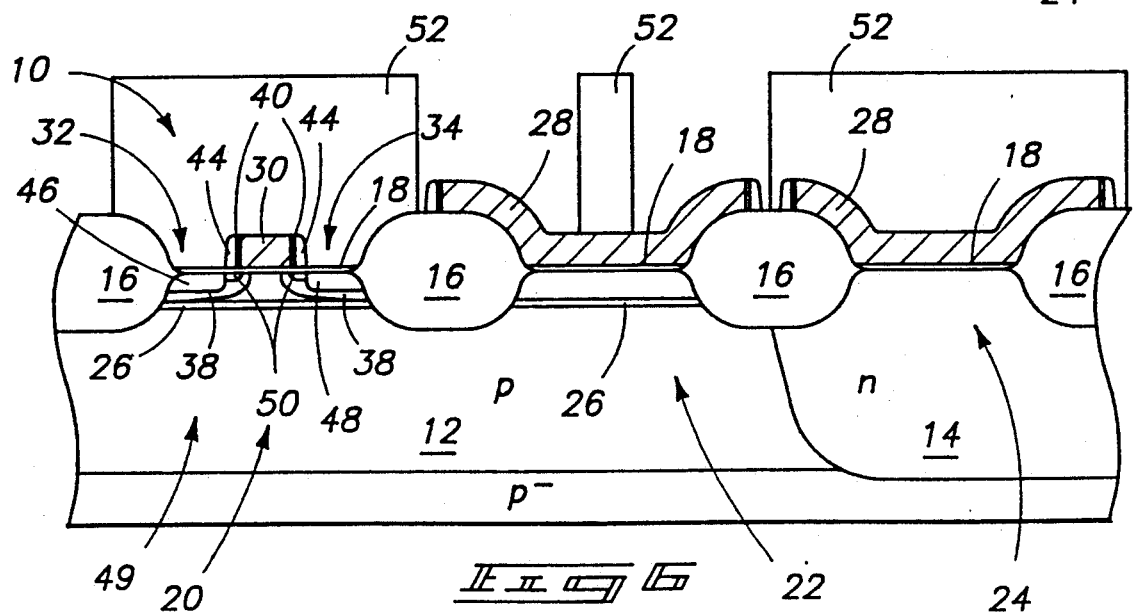

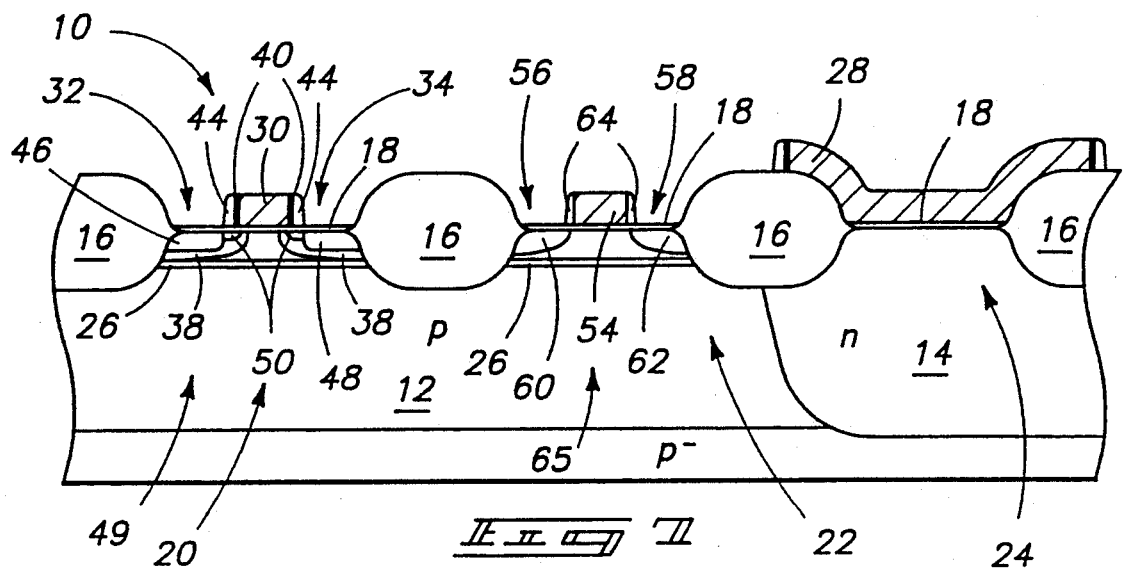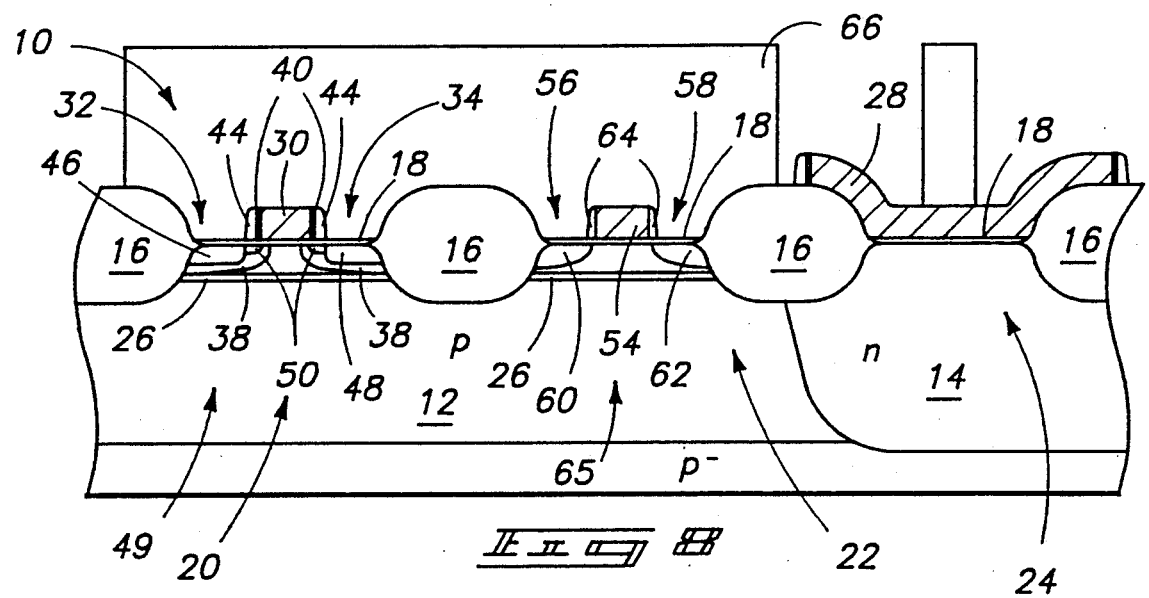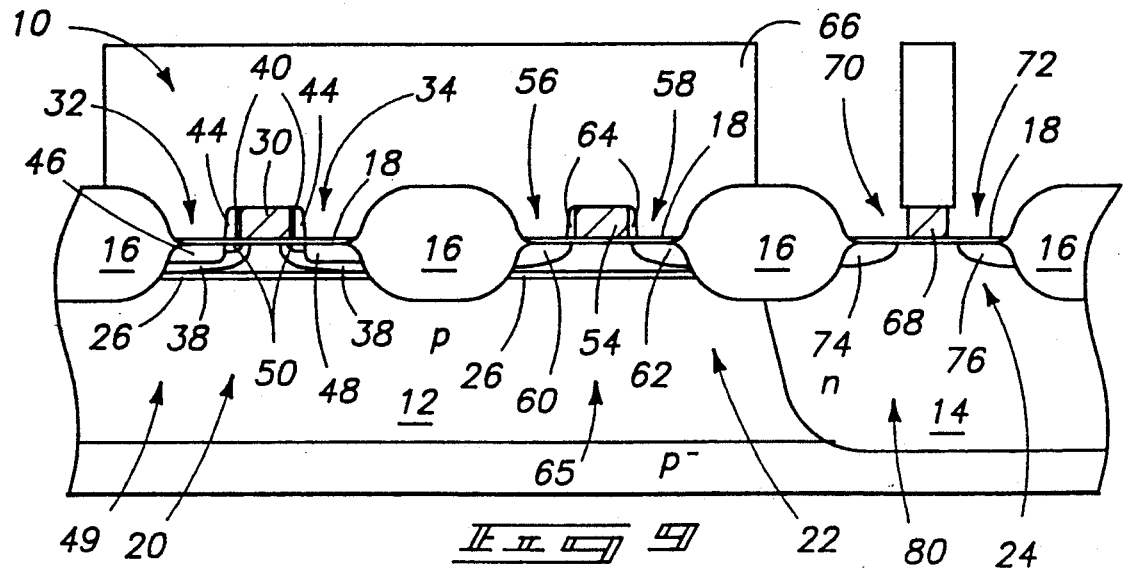

IMPROVED CMOS PROCESSES

TECHNICAL FIELD

This invention relates generally to CMOS processes and memory circuitry containing CMOS transistors.

BACKGROUND OF THE INVENTION

Semiconductor chips are comprised of a series of integrated circuits and devices which include transistors. Transistors are of two general types, namely bipolar and field effect transistors (alternately termed FET). One common type of FET transistor are MOS transistors which are formed of complementary p-type and n-type conductivity material.

Complementary MOS (CMOS) is a MOS circuit formed with both n-channel and p-channel devices, namely a n-type transistor (nMOS) and a p-type transistor (pMOS). The nMOS transistors have their source and drain regions formed of n-type material in a p-type substrate or p-well, while pMOS transistors have their source and drain regions formed of a p-type material in an n-type substrate or n-well. CMOS allows more powerful circuit operation than either n-channel or p-channel circuits alone. This factor, combined with lower power consumption and increased speed, has made CMOS the favorite technology for the manufacture of microprocessors and memory devices.

Memory circuitry typically comprises an array of memory cells, each being comprised of a transistor and an associated capacitor. The operating voltage ($V_{cc}$) of such transistors is typically 5 volts. N-channel transistors operating at 5 volts typically require a lighter doped n-implant region adjacent their active n-regions for reliable operation. Such regions are typically formed adjacent the pair of active n-regions inwardly therebetween by formation of oxide spacers on the edges of the transistor gate. Such regions are commonly referred to as "lightly doped drains" (LDD). However, such regions are positioned inwardly adjacent both of the source and drains of a FET transistor, rather than just the drain region as the terminology implies. One drawback to LDD implants is that they typically require added space on the wafer than non-LDD transistors due to the extra space required for the implants between the active n-regions.

As transistor feature sizes have become smaller due to higher densities, the DRAM memory cell n-channel transistors are expected to require internal $V_{cc}$ voltages of approximately 3.3 volts. At such operation voltages, LDD structures may not be desirable or necessary. However, some peripheral n-channel devices outside of the DRAM memory cell will need to be designed to handle, at burn-in testing, operating voltages of 5.0 volts or higher, which may require LDD and its associated spacer technology.

BRIEF DESCRIPTION OF THE DRAWINGS

Preferred embodiments of the invention are described with reference to the accompanying drawings, in which:

FIG. 4 is a diagrammatic section view of the FIG. 1 wafer shown at a processing step subsequent to that illustrated by FIG. 3.

FIG. 5 is a diagrammatic section view of the FIG. 1 wafer shown at a processing step subsequent to that illustrated by FIG. 4.

FIG. 6 is a diagrammatic section view of the FIG. 1 wafer shown at a processing step subsequent to that illustrated by FIG. 5.

FIG. 7 is a diagrammatic section view of the FIG. 1 wafer shown at a processing step subsequent to that illustrated by FIG. 6.

FIG. 8 is a diagrammatic section view of the FIG. 1 wafer shown at a processing step subsequent to that illustrated by FIG. 7.

FIG. 9 is a diagrammatic section view of the FIG. 1 wafer shown at a processing step subsequent to that illustrated by FIG. 8.

DETAILED DESCRIPTION OF THE PREFERRED EMBODIMENTS

Figure 1:
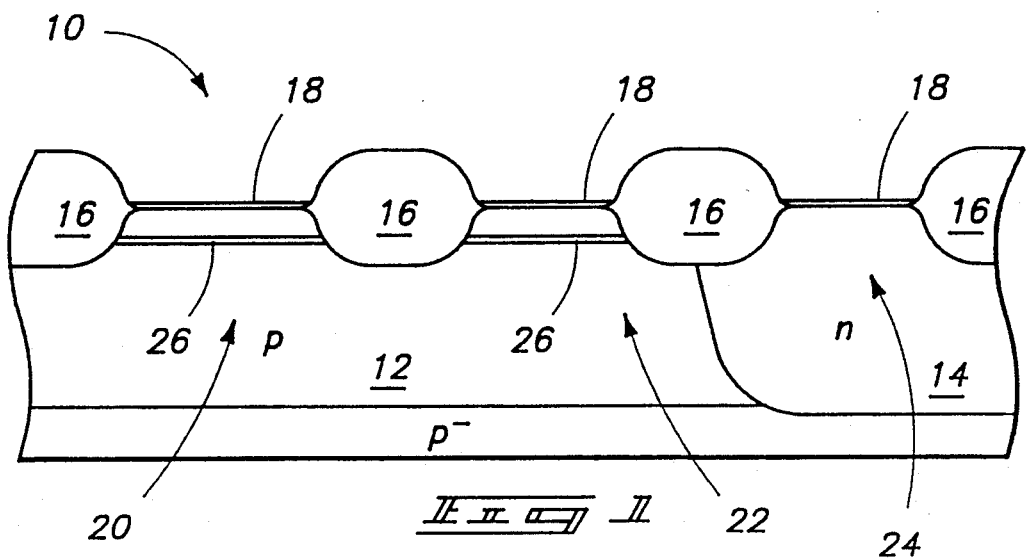
FIG. 1 is a diagrammatic section view of the semiconductor wafer at a process step in accordance with the invention.

The following disclosure of the invention is submitted in furtherance with the constitutional purpose of the Patent Laws "to promote the progress of science and useful arts" (Article 1, Section 8).

In one aspect, the invention comprises an improved process for fabricating CMOS integrated circuits in semiconductor wafers having p-type regions and n-type regions. In accordance with another aspect of the invention, a semiconductor chip having an array of memory cells and peripheral integrated circuitry comprises:

CMOS transistors in the memory array, with the n-channel transistors of the array being formed without LDD regions; and the peripheral integrated circuitry comprising n-channel FET transistors, with such n-channel FET transistors being formed with LDD regions.

The preferred embodiment CMOS process produces a combination of n-channel MOS transistors having LDD regions, n-channel transistors void of LDD regions, and p-channel MOS transistors. In accordance with this aspect of the preferred embodiment, the process comprises:

providing upper field and gate insulating layers on a semiconductor wafer and defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the first portion, and to cover the second and third portions;

doping exposed areas with n-type dopant material to a selected first concentration to form LDD regions in the first portion, the conductive material masking the covered second and third portions from implantation of n-type dopant material during such first concentration doping;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions, the conductive material masking the covered second and third portions from implantation of n-type dopant material during such second concentration doping;

selectively patterning the conductive material layer to define a gate and exposed source and drain areas within the second portion, and to cover the third portion;

doping exposed areas with n-type dopant material to a selected third concentration to form a source and a drain in the second portion which is void of LDD regions, the conductive material masking the covered third portion from implantation of n-type dopant material during such third concentration doping;

selectively patterning the conductive material layer to define a gate and exposed source and drain areas within the third portion; and doping exposed areas with p-type dopant material to a selected fourth concentration to form a source and a drain in the third portion.

Such a process is more particularly described with reference to FIGS. 1-10. There illustrated is a p-type substrate wafer 10 having a p-type region 12, and n-type region 14. Example dopant concentrations would be $1 \times 10^{15}$ atoms/cm$^3$ for the p-substrate; $1 \times 10^{16}$ atoms/cm$^3$ for the p-type region 12; and $1 \times 10^{17}$ atoms/cm$^3$ for the n-type region 14. Referring first to FIG. 1, upper field and gate insulating layers or regions 16, 18 respectively, are provided and patterned atop wafer 10. An example material for such regions would be oxide. Field and gate oxide regions 16, 18 define a first portion 20 in p-type region 12 for formation of an n-channel MOS transistor having LDD regions. They further define a second portion 22 in p-type region 12 for formation of an n-channel MOS transistor void of LDD regions. They further define a third portion 24 in n-type region 14 for formation of a p-channel MOS transistor. First portion 20 would typically be wider than second portion 22, the result of the LDD regions to be formed in first portion 20.

A first p-type implant 26 of a selected concentration (hereinafter referred to as the fifth concentration) is provided within first portion 20 and second portion 22 to a depth which will be substantially beneath active transistor regions to be formed within the first and second portions. An example fifth concentration implant would be $8 \times 10^{11}$ ions/cm$^2$, and could be for example boron ions. The purpose of implant 26 is described below.

Figure 2:
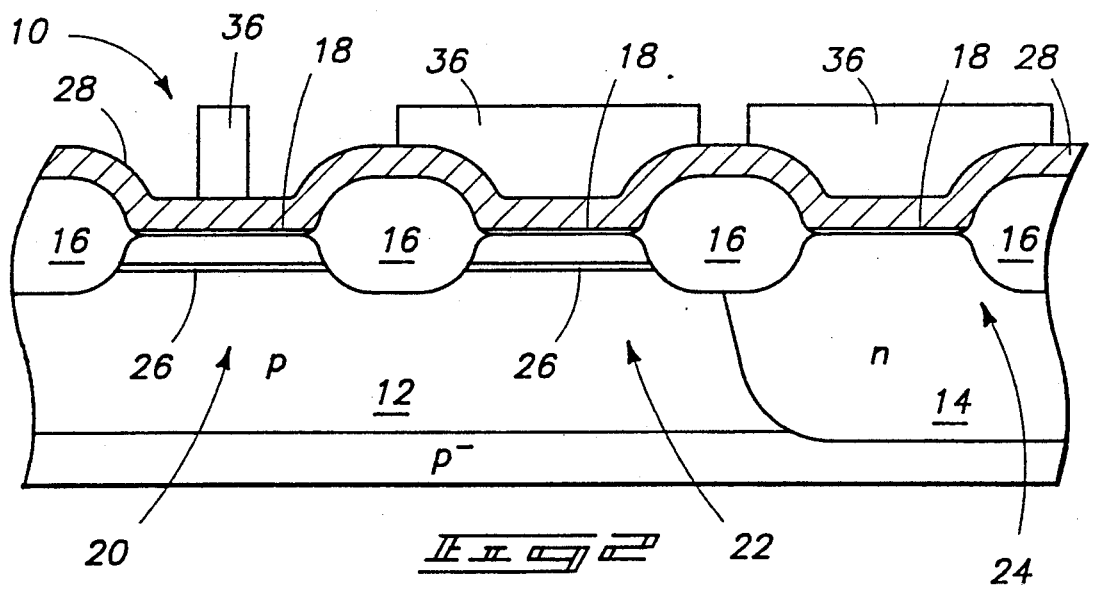
FIG. 2 is a diagrammatic section view of the FIG. 1 wafer shown at a processing step subsequent to that illustrated by FIG. 1.
Figure 3:
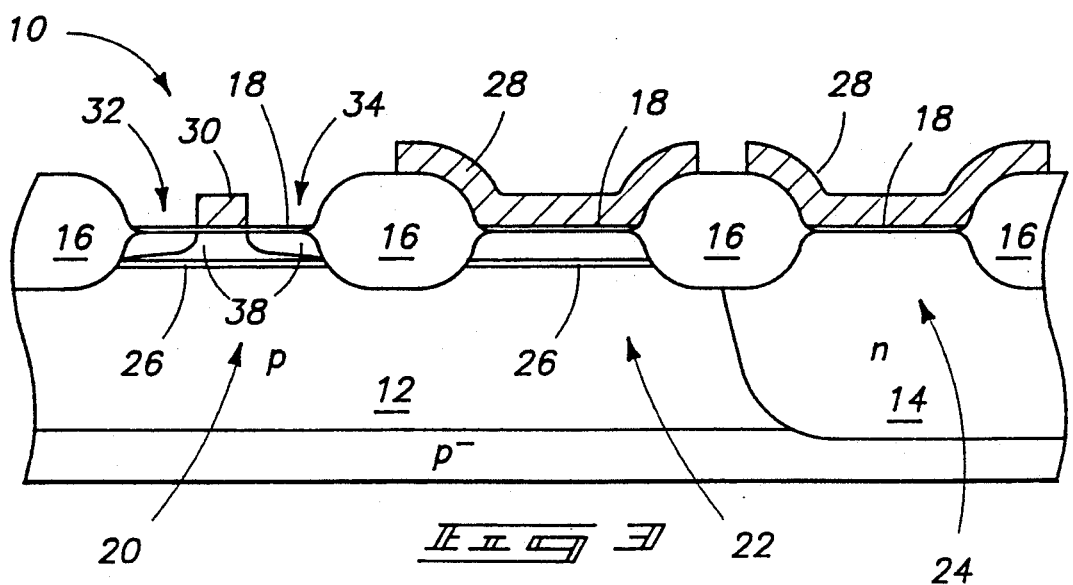
FIG. 3 is a diagrammatic section view of the FIG. 1 wafer shown at a processing step subsequent to that illustrated by FIG. 2.

Referring to FIGS. 2 and 3, a layer of conductive material 28, such as conductively doped polysilicon, is applied atop insulating layers or regions 16, 18. Conductive material layer 28 is selectively patterned to define a gate 30 and exposed source and drain areas 32, 34 respectively, within first portion 20, and to cover second portion 22 and third portion 24 (FIG. 3). Such patterning would typically be performed by applying a layer of photoresist 36 (FIG. 2) and selectively exposing such layer to provide the illustrated profile. Thereafter, with the photoresist in place (FIG. 2), the polysilicon layer 28 would be etched to produce the conductive material layer 28 profile illustrated in FIG. 3.

Exposed areas 32 and 34 are then doped with p-type dopant material of a selected concentration (hereinafter referred to as the sixth concentration) to provide second p-type implants 38. The sixth concentration will typically be greater than the fifth concentration, with an example being $5 \times 10^{12}$ boron ions/cm$^2$. During such sixth concentration doping, the conductive material 28 which covers second portion 22 and third portion 24 masks or prevents implantation of p-type dopant material into the second and third portions.

Referring to FIG. 4, first spacer layers 40 of insulating material are formed or applied along the exposed outer edges of first portion gate 30. An example material would be oxide. Oxide layers would similarly be applied or formed during such formation about any exposed edges of the other portions of conductive layer 28. Spacer layers 40 cover inner edge portions of the underlying p-type implants 38.

Next, the exposed portions of areas 32 and 34 are doped with n-type dopant material to a selected concentration (hereinafter referred to as the first concentration) for providing n-type implants 42 which will be used to form LDD regions in first portion 20. Conductive material 28 masks the covered second portion 22 and third portion 24 from implantation of n-type dopant material during such first concentration doping. An example n-type dopant material would be phosphorous, with an example first concentration being $1 \times 10^{13}$ ions/cm$^2$.

Referring to FIG. 5, insulating spacers in the form of second spacer layers 44 are formed or applied over first spacer layer 40 over or along edges of first portion gate 30. This covers portions of underlying n-type first concentration implant region 42. (This covered area will be the LDD regions.) The exposed portions of areas 32 and 34 are then doped with n-type dopant material to a selected concentration (hereinafter referred to as the second concentration) which is greater than the first concentration to form a source implant 46 and drain implant 48 within first portion 20. This will complete definition of LDD regions, indicated by numeral 50, which are inwardly adjacent source and drain implants 46, 48 respectively, and fully form an n-channel LDD MOS transistor 49. An example second concentration implant would be $1 \times 10^{16}$ arsenic ions/cm$^2$. During such second concentration doping, the conductive material 28 in covered second portion 22 and third portion 44 protects such portions from implantation of n-type dopant material. It will of course be appreciated by the artisan that the position or designation of source and drains 46, 48 could be reversed without departing from the principles and scope of the invention.

The surrounding p-type implants 38 and 26 facilitate operation and reliability of MOS transistor 49. P-type region 38 (FIG. 5) assists in decreasing the depletion width between the source and drain. P-type implant region 26 assists in providing a barrier to prevent undesired leakage from drain to source. The relationship of the np junction created by the higher concentration of p-material diminishes the depletion width though the substrate bulk from reaching the source, causing higher breakdown voltage from drain to source.

Both p-implant 38 and n-implant 42 (FIG. 4) will diffuse during the heating of the wafer which ensues in subsequent doping steps. The implants using spacers 40 and 44 will assure that the p-implant diffuses in advance of the LDD n-implant to provide the profile of FIG. 5.

Referring to FIG. 6, a layer of photoresist 52 would be applied and selectively patterned as indicated to cover first portion 22 and third portion 24, and to cover an area of conductive material 28 in second portion 22 for formation of a gate.

Referring to FIGS. 6 and 7, the exposed conductive material 28 would then be etched to define a gate 54 and exposed source area 56 and drain area 58 within second portion 22, with conductive material 28 still covering third portion 24. Then before removing photoresist 52 (FIG. 6, but after etch), exposed areas 56 and 58 are doped with n-type dopant material to a selected concentration (hereinafter the third concentration) to form a source implant 60 and drain implant 62 in second portion 24. This thereby forms a non-LDD n-channel MOS transistor 65. During such doping, the conductive material 28 and overlying layer of photoresist of covered third portion 24 masks or otherwise prevents implantation of n-type dopant material during the third concentration doping. Following the third concentration doping, the layer of photoresist is removed. An example third concentration would be $5 \times 10^{15}$ arsenic atoms/cm$^2$. It will of course be appreciated by the artisan that the concentration of the source and drain of transistor 49 and transistor 65 can be selected to be the same or different.

Layers 64 of reinforcing material, such as insulating oxide, can be applied on exposed edges of second portion gate 54 prior to doping the exposed second portion areas with n-type dopant material of the third concentration. Such layers 64 function to reinforce the integrity of second portion gate 54.

Referring to FIG. 8, a layer of photoresist 66 is applied and selectively exposed to cover first portion 20 and second portion 22, and to cover a portion of conductive material 28 in third portion 26 for formation of a gate therein.

Referring to FIG. 9, conductive material 28 in third portion 26 is etched to define a gate 68 and exposed source area 70 and drain area 72 within third portion 26. As illustrated, the subject etch is preferably a photoresist undercutting etch which produces a photoresist overhang over the outer edges of gate 68. Before removing the photoresist, exposed areas 70 and 72 are doped with a p-type dopant material to a selected concentration (hereinafter the fourth concentration) to form a source implant 74 and a drain implant 76, to form p-channel MOS transistor 80. The overhang spaces region 74 and 76 slightly laterally outward from gate 68 to allow for the high diffusivity of p implant material upon subsequent heating of the wafer, as is well known within the art. An example fourth concentration implant would be $8 \times 10^{15}$ BF$_2$/cm$^2$.

Figure 10:
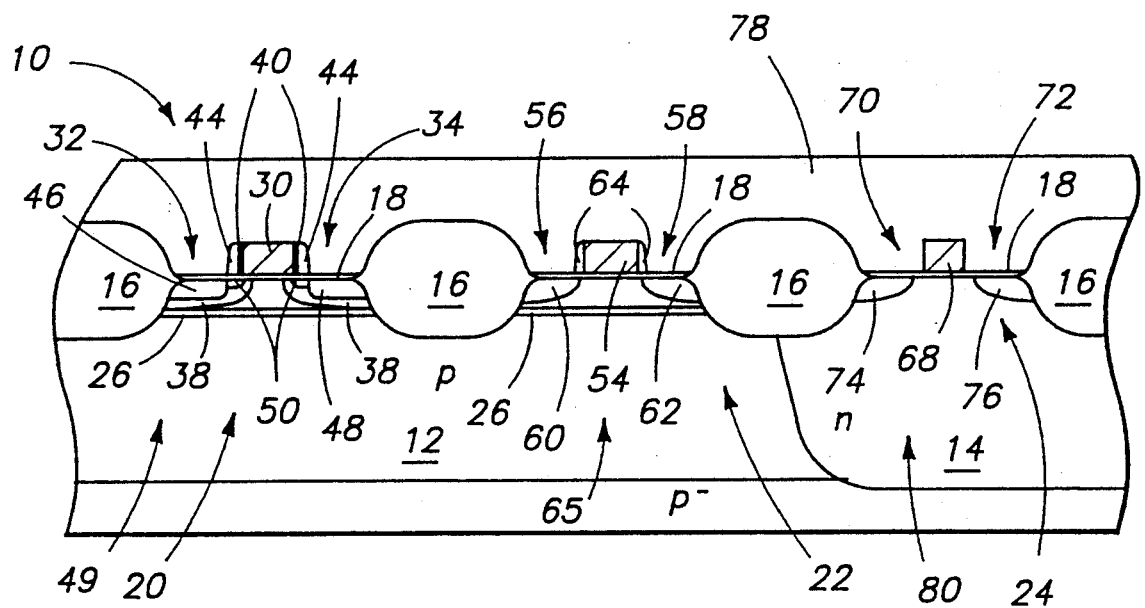
FIG. 10 is a diagrammatic section view of the FIG. 1 wafer shown at a processing step subsequent to that illustrated by FIG. 9.

Referring to FIG. 10, a layer 78 of insulating material such as oxide is then applied atop the wafer and contacts etched as desired.

It will also be recognized that the above enumerated selective patterning steps of the preferred process comprises application and exposure of a phtoresist layer to define the gate in the particular first, second or third portion, such that photoresist covers the remaining of the first, second and third portions after exposure.

The preferred sequence of steps is as described above, namely formation of the LDD n-channel transistor first, followed by formation of the n-channel non-LDD transistor, and finally with formation of the p-channel transistor. This method is preferred due to the greater number of steps required for formation of the LDD n-channel transistor. The sequence of transistor formation could of course be changed however without departing from the principles and scope of the invention.

Fabrication of such wafers enables more compaction of transistors due to elimination of non-LDD spacers in selective n-channel transistors.

It will also be appreciated by those skilled in the art that the above process could be utilized for fabrication of a wafer having MOS transistors which are principally or entirely n-channel MOS transistors void of LDD regions and p-channel MOS transistors. Such a process would comprise:

providing upper field and gate insulating layers on a semiconductor wafer and defining a first portion in a p-type region for formation of an n-channel MOS transistor void of LDD regions, and a second portion in a n-type region for formation of a p-channel MOS transistor;

applying a layer of conductive material atop the insulating layers;

selectively patterning the conductive material layer to define a gate and exposed source and drain areas within the first portion, and to cover the second portion;

doping exposed areas with n-type dopant material to a selected first concentration to form a source and a drain in the second portion which is void of LDD regions, the conductive material masking the covered second portion from implantation of n-type dopant material during such first concentration doping;

selectively patterning the conductive material layer to define a gate and exposed source and drain areas within the second portion; and doping exposed areas with p-type dopant material to a selected second concentration to form a source and a drain in the second portion.

The order for the immediately above process could of course be reversed whereby p-channel MOS transistors are formed before n-channel MOS transistors which are void of LDD spacers.

Processes in accordance with the invention would enable formation of a semiconductor chip having an array of memory cells with non-LDD transistors in the array, and LDD transistors in the periphery. Such a chip would enable use of higher voltage at burn-in testing in connection with the periphery circuitry, and lower operating voltages (for example, 3.3 volts) within the array for operation of the memory circuitry. This enables more compaction of memory circuitry.

This process allows standard 5 V supply operation for integrated circuits. Accordingly, current computer systems designed at 5 V power supplies would not have to be redesigned for lower supplies. Also, 5 V supply means 8 V operation in the burn-in ovens, as is well known in the art.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A process for fabricating CMOS integrated circuits in semiconductor wafers having p-type regions and n-type regions, the process comprising the following steps:

provinding upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the first portion, and to cover the second and third portions;

doping exposed areas with n-type dopant material to a selected first concentratin to form LDD regions in the first portion, the conductive material masking the covered second and third portions from implantation of n-type dopant material during such first concentration doping;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions, the conductive material masking the covered second and third portions from implantation of n-type dopant material during such second concentration doping;

selectively patterning the conductive material layer to define a gate and exposed source and drain areas within the second portion, and to cover the third portion;

doping exposed areas with n-type dopant material to a selected third concentration to form a source and a drain in the second portion which is void of LDD regions, the conductive material masking the covered third portion from implantation of n-type dopant material during such third concentration doping;

selectively patterning the conductive material layer to define a gate and exposed source and drain areas within the third portion; and doping exposed areas with p-type dopant material to a selected fourth concentration to form a source and a drain in the third portion.

2. The process for fabricating CMOS integrated circuits of claim 1 wherein the recited conductive material is everywhere conductively doped polysilicon.

3. The process for fabricating CMOS integrated circuits of claim 1 wherein the selective patterning steps each comprise application and exposure of a photoresist layer to define the gate in the particular first, second, or third portion, such photoresist covering the remaining of the first, second, and third portions after exposure.

4. The process for fabricating CMOS integrated circuits of claim 1 further comprising providing a first p-type implant of a selected fifth concentration within the first portion.

5. The process for fabricating CMOS integrated circuits of claim 4 wherein the selective patterning steps each comprise application and exposure of a photoresist layer to define the gate in the particular first, second, or third portion, such photoresist covering the remaining of the first, second, and third portions after exposure.

6. The process for fabricating CMOS integrated circuits of claim 1 further comprising providing a first p-type implant of a selected fifth concentration within the first portion and within the second portion.

7. The process for fabricating CMOS integrated circuits of claim 1 further comprising:

doping exposed areas within the first portion with p-type dopant material of a selected sixth concentration after selectively patterning the conductive material layer to define a gate and exposed source and drain areas within the first portion;

applying a first spacer layer of insulating material along edges of the first portion gate;

then doping exposed areas of the first portion with the n-type dopant material of the selected first concentration for formation of LDD regions;

applying a second spacer layer of insulating material over the first spacer layer along edges of the first portion gate to cover portions of the LDD regions within the first portion; and then doping exposed areas of the first portion with the n-type dopant material of the selected second concentration for formation of the first portion source and drains.

8. The process for fabricating CMOS integrated circuits of claim 7 wherein the selective patterning steps each comprise application and exposure of a photoresist layer to define the gate in the particular first, second, or third portion, such photoresist covering the remaining of the first, second, and third portions after exposure.

9. The process for fabricating CMOS integrated circuits of claim 1 further comprising:

providing a first p-type implant of a selected fifth concentration within the first portion.

doping exposed areas within the first portion with p-type dopant material of a selected sixth concentration to provide a second p-type implant after selectively patterning the conductive material layer to define a gate and exposed source and drain areas within the first portion, the sixth concentration being greater than the fifth concentration;

applying a first spacer layer of insulating material along edges of the first portion gate;

then doping exposed areas of the first portion with the n-type dopant material of the selected first concentration for formation of LDD regions;

applying a second spacer layer of insulating material over the first spacer layer along edges of the first portion gate to cover portions of the LDD regions within the first portion; and then doping exposed areas of the first portion with the n-type dopant material of the selected second concentration for formation of the first portion source and drains.

10. The process for fabricating CMOS integrated circuits of claim 9 wherein the selective patterning steps each comprise application and exposure of a photoresist layer to define the gate in the particular first, second, or third portion, such photoresist covering the remaining of the first, second, and third portions after exposure.

11. The process for fabricating CMOS integrated circuits of claim 1 further comprising applying a layer of reinforcing material over edges of the second portion gate prior to doping exposed second portion areas with the n-type dopant material of the third concentration.

12. The process for fabricating CMOS integrated circuits of claim 1 wherein the third portion gate is selectively patterned by a photoresist undercutting etch which produces a photoresist overhang, and wherein the doping of the exposed third portion areas with p-type dopant material is conducted prior to removing the photoresist overhang.

13. The process for fabricating CMOS integrated circuits of claim 1 further comprising applying a layer of reinforcing material over edges of the second portion gate prior to doping exposed second portion areas with the n-type dopant material of the third concentration; and wherein, the third portion gate is selectively patterned by a photoresist undercutting etch which produces a photoresist overhang, and wherein the doping of the exposed third portion areas with p-type dopant material is conducted prior to removing the photoresist overhang.

14. A process for fabricating CMOS integrated circuits in semiconductor wafers having p-type regions and n-type regions, the process comprising the following steps:

providing upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the first portion, and to cover the second and third portions;

doping exposed areas with n-type dopant material to a selected first concentration to form LDD regions in the first portion, the conductive material masking the covered second and third portions from implantation of n-type dopant material during such first concentration doping;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions, the conductive material masking the covered second and third portions from implantation of n-type dopant material during such second concentration doping;

selectively patterning the conductive material layer to define a gate and exposed source and drain areas within the third portion, and to cover the second portion;

doping exposed areas with p-type dopant material to a selected fourth concentration to form a source and a drain in the third portion, the conductive material masking the covered second portion from implantation of p-type dopant material during such fourth concentration doping;

selectively patterning the conductive material layer to define a gate and exposed source and drain areas within the second portion; and doping exposed areas with n-type dopant material to a selected third concentration to form a source and a drain in the second portion which is void of LDD regions.

15. A process for fabricating CMOS integrated circuits in semiconductor wafers having p-type regions and n-type regions, the process comprising the following steps:

providing upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the second portion, and to cover the first and third portions;

doping exposed areas with n-type dopant material to a selected third concentration to form a source and a drain in the second portion which is void of LDD regions, the conductive material masking the covered first and third portions from implantation of n-type dopant material during such third concentration doping;

selectively patterning the conductive material layer to define a gate and exposed source and drain areas within the first portion, and to cover the third portion;

doping exposed areas with n-type dopant material to a selected first concentration to form LDD regions in the first portion, the conductive material masking the covered third portion from implantation of n-type dopant material during such first concentration doping;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions, the conductive material masking the covered third portion from implantation of n-type dopant material during such second concentration doping;

selectively patterning the conductive material layer to define a gate and exposed source and drain areas within the third portion; and doping exposed areas with p-type dopant material to a selected fourth concentration to form a source and a drain in the third portion.

16. A process for fabricating CMOS integrated circuits in semiconductor wafers having p-type regions and n-type regions, the process comprising the following steps:

providing upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the second portion, and to cover the first and third portions;

doping exposed areas with n-type dopant material to a selected third concentration to form a source and a drain in the second portion which is void of LDD regions, the conductive material masking the covered first and third portions from implantation of n-type dopant material during such third concentration doping;

selectively patterning the conductive material layer to define a gate and exposed source and drain areas within the third portion, and to cover the first portion;

doping exposed areas with p-type dopant material to a selected fourth concentration to form a source and a drain in the third portion, the conductive material masking the covered first portion from implantation of p-type dopant material during such fourth concentration doping;

selectively patterning the conductive material layer to define a gate and exposed source and drain areas within the first portion;

doping exposed areas with n-type dopant material to a selected first concentration to form LDD regions in the first portion;

forming insulating spacers over edges of the conductive material defining the first portion gate to cover portions of the LDD regions within the first portion; and doping exposed areas with n-type dopant material to a selected second concentration which is greater than the first concentration to form a source and a drain in the first portion having LDD regions.

17. A process for fabricating CMOS integrated circuits in semiconductor wafers having p-type regions and n-type regions, the process comprising the following steps:

providing upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the third portion, and to cover the first and second portions;

doping exposed areas with p-type dopant material to a selected fourth concentration to form a source and a drain in the third portion, the conductive material masking the covered first and second portions from implantation of p-type dopant material during such third concentration doping;

selectively pattering the conductive material layer to define a gate and exposed source and drain areas within the first portion, and to cover the second portion;

doping exposed areas with n-type dopant material to a selected first concentration to form LDD regions in the first portion, the conductive material masking the covered second portion from implantation of n-type dopant material during such first concentration doping;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions, the conductive material masking the covered second portion from implantation of n-type dopant material during such second concentration doping;

selectively patterning the conductive material layer to define a gate and exposed source and drain areas within the second portion; and doping exposed areas with n-type dopant material to a selected third concentration to form a source and a drain in the second portion which is void of LDD regions.

18. A process for fabricating CMOS integrated circuits in semiconductor wafers having p-type regions and n-type regions, the process comprising the following steps:

providing upper field and gate insulating layers on a semiconductor wafer; defining a first portion in a p-type region for formation of an n-channel MOS transistor having LDD regions, a second portion in a p-type region for formation of an n-channel MOS transistor void of LDD regions, and a third portion in an n-type region for formation of a p-channel MOS transistor;

applying a layer of conductive material atop the insulating layers;

selectively patterning the conductive material layer to define a gate and exposed source and drain areas within the third portion, and to cover the first and second portions;

doping exposed areas with p-type dopant material to a selected fourth concentration to form a source and a drain in the third portion, the conductive material masking the covered first and second portions from implantation of p-type dopant material during such third concentration doping;

selectively patterning the conductive material layer to define a gate and exposed source and drain areas within the second portion, and to cover the first portion;

doping exposed areas with n-type dopant material to a selected third concentration to form a source and a drain in the second portion which is void of LDD regions, the conductive material masking the covered first portion from implantation of n-type dopant material during such third concentration doping;

selectively patterning the conductive material layer to define a gate and exposed source and drain areas within the first portion;

doping exposed areas with n-type dopant material to a selected first concentration to form LDD regions in the first portion;

forming insulating spacers over edges of the conductive material defining the first portion gate to cover portions of the LDD regions within the first portion;

doping exposed areas with n-type dopant material to a selected second concentration which is greater than the first concentration to form a source and a drain in the first portion having LDD regions.

* * * * *